US011527851B2

United States Patent
Nguyen

(10) Patent No.: US 11,527,851 B2
(45) Date of Patent: Dec. 13, 2022

(54) ELECTRONIC PORT HAVING A LOCKING ASSEMBLY FOR SECURING AN ELECTRONIC PLUG

(71) Applicant: HEWLETT PACKARD ENTERPRISE DEVELOPMENT LP, Houston, TX (US)

(72) Inventor: Tri Luong Nguyen, Santa Clara, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 11 days.

(21) Appl. No.: 17/213,475

(22) Filed: Mar. 26, 2021

(65) Prior Publication Data

US 2022/0311187 A1 Sep. 29, 2022

(51) Int. Cl.
| | |
|---|---|
| *H01R 13/639* | (2006.01) |
| *H01R 13/621* | (2006.01) |
| *H01R 43/26* | (2006.01) |
| *H05K 1/18* | (2006.01) |
| *H01R 24/60* | (2011.01) |
| *H01R 12/58* | (2011.01) |

(52) U.S. Cl.
CPC ......... *H01R 13/639* (2013.01); *H01R 13/621* (2013.01); *H01R 43/26* (2013.01); *H01R 12/58* (2013.01); *H01R 24/60* (2013.01); *H01R 2201/06* (2013.01); *H05K 1/18* (2013.01); *H05K 2201/09163* (2013.01)

(58) Field of Classification Search
CPC .... H01R 13/62; H01R 13/621; H01R 13/639; H01R 13/627; H01R 43/26; H01R 24/60; H01R 12/58; H01R 2201/06; H05K 1/18; H05K 2201/09163

USPC ................................ 439/345, 347, 349, 359
See application file for complete search history.

(56) References Cited

U.S. PATENT DOCUMENTS

| | | | |
|---|---|---|---|
| 8,092,241 B2 * | 1/2012 | Chang .................... | H01R 13/70 439/305 |
| 9,362,673 B1 | 6/2016 | Rinker | |
| 9,553,408 B2 | 1/2017 | Ahn | |

(Continued)

FOREIGN PATENT DOCUMENTS

| | | |
|---|---|---|
| JP | 2006133920 | 5/2006 |
| KR | 101865165 | 5/2017 |
| WO | WO-2016117644 | 7/2016 |

*Primary Examiner* — Gary F Paumen
(74) *Attorney, Agent, or Firm* — Hewlett Packard Enterprise Patent Department

(57) ABSTRACT

Example implementations relate to an electronic port of a computing system, having a locking assembly to secure an electronic plug within the electronic port. The electronic port includes a receptacle, a bracket, a biasing member, and a fastener. The receptacle includes a plurality of retainers to releasably hold a connector of the electronic plug, when the electronic plug is detachably coupled to the electronic port. The bracket is disposed around the receptacle. The bracket has a plurality of locking elements and a pillar having a counter bore. The plurality of locking elements is aligned with the plurality of retainers. The fastener is projected into the pillar through an enclosure, where the fastener is fastened into the counter bore of the pillar to allow a vertical movement of the bracket along a first direction for engaging the plurality of locking elements with the plurality of retainers.

20 Claims, 9 Drawing Sheets

(56) References Cited

U.S. PATENT DOCUMENTS

| | | | |
|---|---|---|---|
| 9,646,179 B1 | 5/2017 | Munns et al. | |
| 2010/0317215 A1* | 12/2010 | Chang | H01R 13/6397 |
| | | | 439/305 |
| 2011/0008986 A1* | 1/2011 | Thom | H01R 13/62933 |
| | | | 439/347 |
| 2013/0217252 A1* | 8/2013 | Carden | H01R 13/6581 |
| | | | 439/304 |
| 2015/0346436 A1* | 12/2015 | Pepe | G02B 6/3825 |
| | | | 385/76 |

* cited by examiner

ELECTRONIC PORT HAVING A LOCKING ASSEMBLY FOR SECURING AN ELECTRONIC PLUG

BACKGROUND

Computing systems, such as servers, storages, wireless access points or the like may include at least one, and typically, multiple electronic Input-Output (IO) ports, for example, universal serial bus (USB) ports. In such examples, electronic plugs, for example, USB plugs may be connected to the computing system via the USB ports for storing, processing, receiving, or transferring data. Because, the USB plugs are designed to be removable from the USB ports of the computing system in a "plug and play" manner, the USB ports may have a standardized connection interface for the USB plugs, such as mouse, keyboards, scanners, digital cameras, printers, external displays, external storage devices, or the like.

BRIEF DESCRIPTION OF THE DRAWINGS

Various examples will be described below with reference to the following figures.

DETAILED DESCRIPTION

Figure 1:
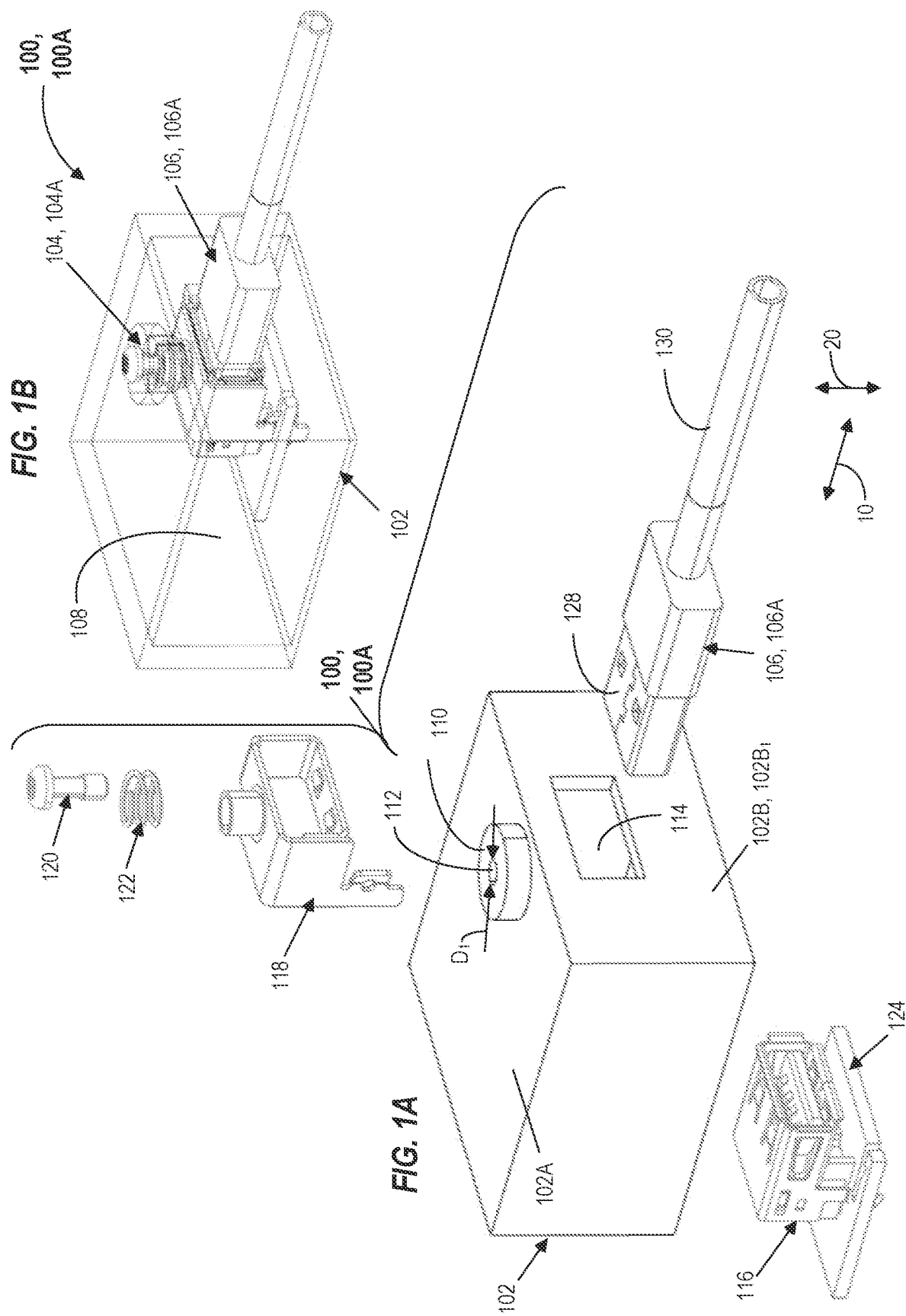
FIG. 1A illustrates an exploded view of a computing system having an electronic port and an electronic plug according to an example implementation of the present disclosure.
FIG. 1B illustrates an assembled view of the computing system of FIG. 1A according to an example implementation of the present disclosure.

The following detailed description refers to the accompanying drawings. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

The terminology used herein is for the purpose of describing example embodiments only and is not intended to be limiting. As used herein, the singular forms "a," "an," and "the" are intended to include the plural forms as well, unless the context clearly indicates otherwise. The term "plurality," as used herein, is defined as two, or more than two. The term "another," as used herein, is defined as at least a second or more. The term "coupled," as used herein, is defined as connected, whether directly without any intervening elements or indirectly with at least one intervening elements, unless otherwise indicated. Two elements may be coupled mechanically, electrically, or communicatively linked through a communication channel, pathway, network, or system. The term "and/or" as used herein refers to and encompasses any and all possible combinations of one or more of the associated listed items. It will also be understood that, although the terms first, second, third, etc. may be used herein to describe various elements, these elements should not be limited by these terms, as these terms are only used to distinguish one element from another unless stated otherwise or the context indicates otherwise. As used herein, the term "includes" means includes but not limited to, the term "including" means including but not limited to. The term "based on" means based at least in part on. As used herein, the term "computing system" may refer to a compute infrastructure, such as an access point (AP), a server system, a storage system, a power conversion system, a communication system, or a networking system, having an electronic port for receiving an electronic plug. As used herein the term "access point" may refer to a type of the computing system, which creates a wireless local area network (WLAN) by i) connecting to a router, switch, or hub via an Ethernet cable, and ii) projecting a Wi-Fi signal to a designated area. As used herein, the term "electronic port" may refer to any one type of a port having a receptacle or a socket, which is native to the computing system, or which is integral to the computing system, and may provision a connector of the electronic plug to be detachably connected to the electronic port. As used herein, the term "electronic plug" may refer to any one type of a plug having the connector, which is not native to the computing system, or which is ancillary to the computing system, and may have to be connected by way of fitting or plugging into the receptacle of the electronic port for storing, transmitting, receiving, or processing of data or the like. As used herein, the term "biasing member" may refer to a type of a flexible component, which may be compressed/elongated by applying a force, held in a compressed position, and restored to an original position from the compressed position upon release of the applied force. For example, the biasing member may be a spring, a bellow, or the like. As used herein, the term "vertical movement" may refer to a movement of a bracket along a direction, which is perpendicular to the direction of the movement of the electronic plug, when coupled to the electronic port.

The present disclosure describes example implementations of an electronic port of a computing system having a locking assembly to secure an electronic plug within the electronic port. The electronic port may include a receptacle, a bracket, and a fastener, where the bracket and the fastener may collectively work in tandem to function as the locking assembly of the electronic port. In some examples, the receptacle may include a plurality of retainers to releasably hold a connector of the electronic plug, when the electronic plug is detachably coupled the electronic port. The bracket having may be disposed around the receptacle, where the bracket includes a plurality of locking elements and a pillar having a counter bore, and where the plurality of locking elements is aligned with the plurality of retainers. The fastener may be projected into the pillar through an enclosure, where the fastener may be fastened into the counter bore of the pillar to allow a vertical movement of the bracket along a first direction so as to engage the plurality of locking elements with the plurality of retainers for locking the electronic plug within the electronic port.

Figure 9:
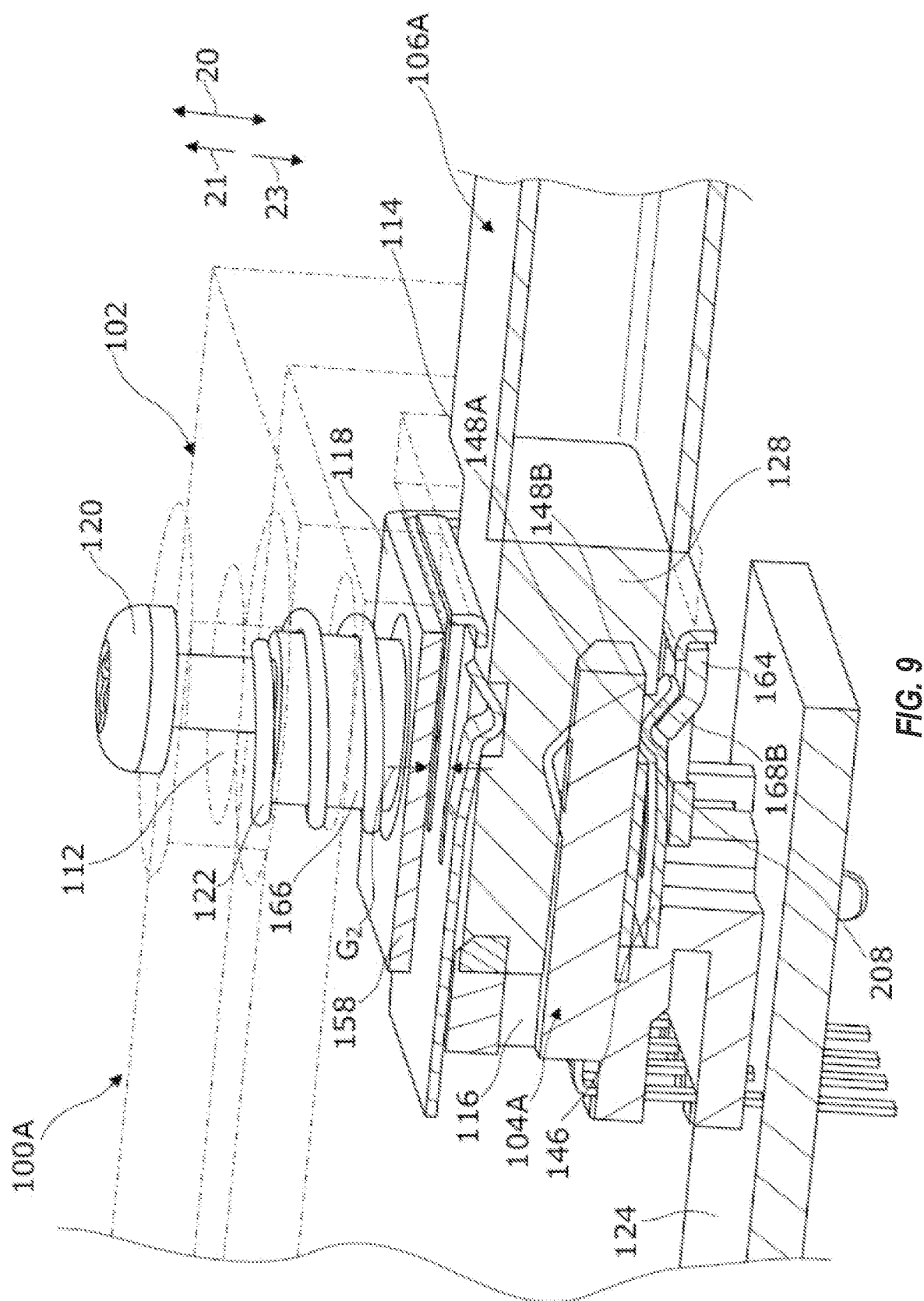
FIG. 9 illustrates a cross-sectional view of a portion of the computing system of FIGS. 1A and 1B having the electronic plug connected to the electronic port and retained in a lock stage within the electronic port according to an example implementation of the present disclosure.
Figure 10:
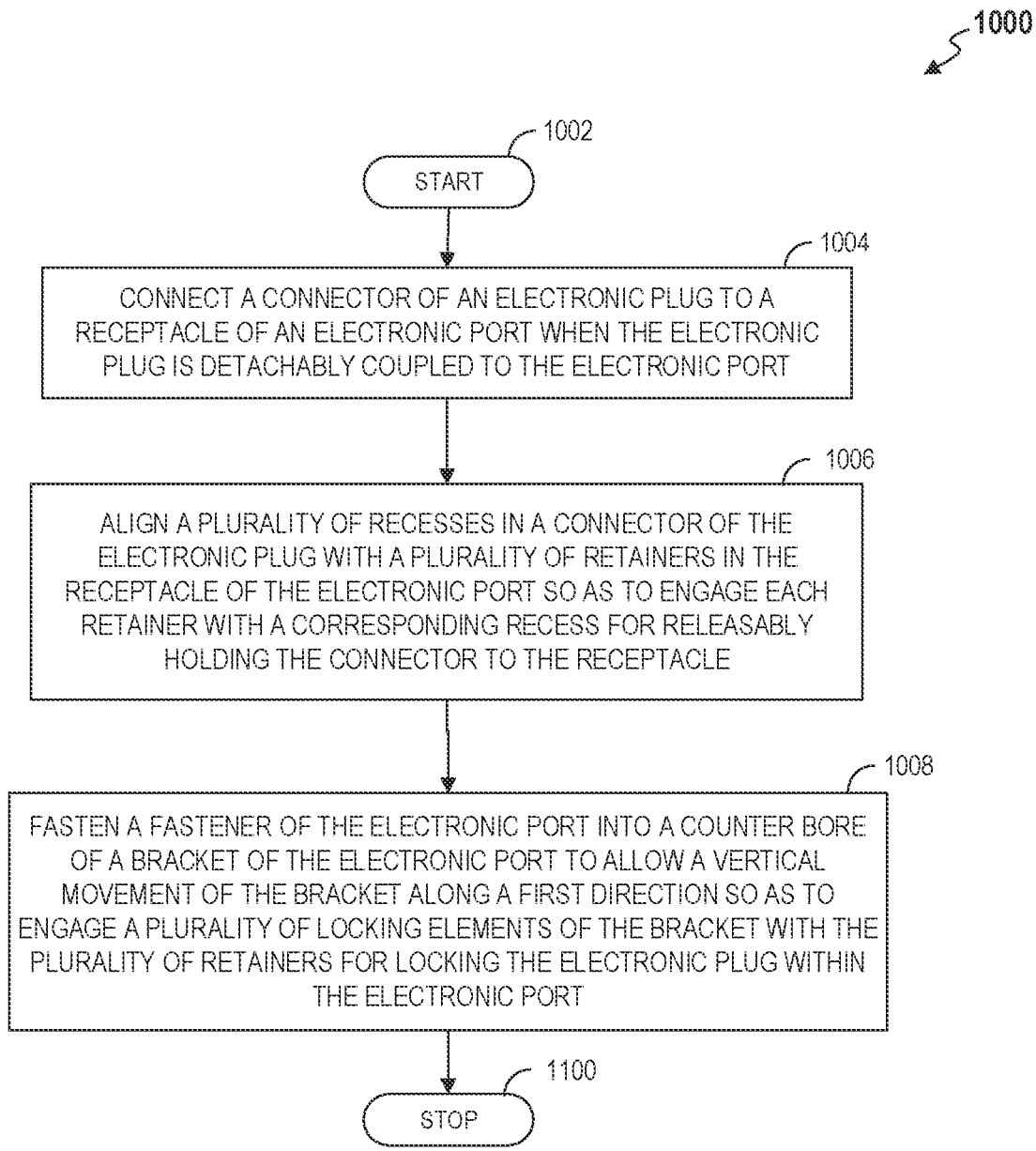
FIG. 10 is a flow diagram depicting a method of locking an electronic plug within an electronic port of a computing system according to an example implementation of the present disclosure.

For purposes of explanation, certain examples are described with reference to the components illustrated in FIGS. 1-10. The functionality of the illustrated components may overlap, however, and may be present in a fewer or greater number of elements and components. Further, all or part of the functionality of illustrated elements may co-exist or be distributed among several geographically dispersed locations. Moreover, the disclosed examples may be implemented in various environments and are not limited to the illustrated examples. Further, the sequence of operations performed for locking (securing) the electronic plug within the electronic port described in connection with FIGS. 9 and 10, is an example and is not intended to be limiting. Additional or fewer operations or combinations of operations may be used or may vary without departing from the scope of the disclosed examples. Thus, the present disclosure merely sets forth possible examples of implementations, and many variations and modifications may be made to the described examples. Such modifications and variations are intended to be included within the scope of this disclosure and protected by the following claims.

An electronic plug, such as a universal serial bus (USB) plug functioning as at least one of a mobile network modem, a ZigBee dongle, or a Bluetooth dongle, for example, may be used in a computing system, such as an access point connected to a network device via an Ethernet cable. Examples of the network device may include, but are not limited to, switches, routers, hubs, or the like. Typically, the access point has an electronic port, such as a USB port for providing connectivity with the USB plug. In such examples, the USB plug may be easily added to the access point by way of plugging it into the USB port. However, removing the USB plug from the USB port may also as easy as it is added into the USB port, thus making the USB port an easy target for unauthorized removal and theft from the access point. Some previous approaches to secure the USB plug included using an external locking mechanism of the USB plug, to secure it within the access point. However, such external locking mechanism may complicate an authorized removal of the USB plug from the access point. Additionally, a data center, for example, may include several USB plugs in close proximity to one another, thus using the external locking mechanism for securing each of the several USB plugs may become complicated and tedious process. Further, the external locking mechanism are typically bulky in nature, thus making it difficult to use in the access point having space constraints. Thus, overall the usage of the external locking mechanism to secure the USB plug to the access point may be cumbersome or may not be cost effective.

A technical solution to the aforementioned problems may include providing a locking assembly (or a security assembly) within an electronic socket, such as a USB port, to prevent unauthorized removal of the electronic plug, such as a USB plug when plugged into a computing system, such as an access point. In other words, the locking assembly may include components, which are internal to the USB port, which occupies a substantially little space due to its integration with one or more standardized components of the USB ports, and which may have a complementary design to that of standardized components of the USB port, and which are of a miniaturized nature in design. Accordingly, the locking assembly having a simple design may allow the cost to be substantially low. Thus, the locking assembly disclosed herein is self-contained and does not use additional components external to the USB plug.

In some examples, the electronic port, for example, the USB port may include a receptacle, a bracket, a biasing member, and a fastener. The receptacle may be a standardized component of the USB port, whereas the bracket, the biasing member, and the fastener are internal components of the USB port, which may collectively work in tandem to function as the locking assembly of the electronic plug, for example, the USB plug. In some examples, the receptacle includes a plurality of retainers, for example, spring fingers to releasably hold a connector of the USB plug, connected to the receptacle, when the USB plug is detachably coupled to the USB port. In some examples, the connector may also be a standardized component of the USB plug. The bracket is disposed around the receptacle, where it includes a pillar having a counter bore, and a plurality of locking elements, for example, prongs. In such examples, the plurality of locking elements may have a complementary design to that of the plurality of retainers and are aligned vertically below the plurality of retainers. The fastener may be initially projected into the pillar through an opening in an enclosure of the access point, where a head portion of the fastener remains outside of the enclosure. Further, the fastener may be fastened into the counter bore of the pillar for allowing a vertical movement of the bracket along a first direction so as to engage the plurality of locking elements with the plurality of retainers in order to lock the connector of the USB plug held the receptacle of the USB port within the access point. In some examples, the fastener may be a captive screw. In one or more examples, the USB port may further include a biasing member, for example, a spring (e.g., a compression spring) or a bellow disposed around the pillar such that end portions of the biasing member contacts the bracket and the enclosure. In such examples, the biasing member may get compressed to allow the vertical movement of the bracket in the first direction when the fastener is fastened into the counter bore of the pillar. Additionally, the biasing member may get released to allow the vertical movement of the bracket in a second direction opposite to the first direction, when the fastener is unfastened from the counter bore of the pillar so as to disengage the plurality of locking elements from the plurality of retainers in order to unlock the connector of the USB plug held the receptacle of the USB port within the access point.

FIG. 1A depicts an exploded view of a computing system 100. FIG. 1B depicts an assembled view of the computing system 100. In some examples, the computing system 100 may be an access point 100A, which may be configured to create a wireless local area network (WLAN) by i) connecting the access point 100A to networking devices (not shown), such as a router, a switch, or a hub via an Ethernet cable, and ii) projecting a Wi-Fi signal to a designated area. In some other examples, the computing system 100 may be server system, a storage system, a power conversion system, a communication system, or a networking system, or the like without deviating from the scope of the present disclosure. In the example of FIGS. 1A and 1B, the computing system 100 includes an enclosure 102 having an electronic port 104 disposed within the enclosure 102, as shown in FIG. 1B. Further, the electronic port 104 may receive a connector of an electronic plug 106 when it is added (i.e., detachably coupled) to a receptacle of the electronic port 104.

In some examples, the enclosure 102 may be box like component, which may be disposed at a distant location to that of the networking devices, such as the switch, the routers, the hub, or the like, and physically coupled to a support structure (not shown). It may be noted herein that the enclosure 102 is shown as a transparent structure in the example of FIG. 1B so as to depict assembled components of the electronic port 104, and a portion of the electronic plug 106 detachably coupled to the electronic port 104, and such an illustration should not be construed as a limitation of the present disclosure. The enclosure 102 is formed by a cover 102A, a base (not labeled), and a plurality of peripheral walls 102B, which are coupled to one another to define a hollow space 108 there between. The cover 102A includes a cap 110 having an opening 112 extending between an exterior of the cap 110 to the hollow space 108 of the enclosure 102. In the example of FIG. 1A, the opening 112 has a first diameter "$D_1$". In some examples, the opening 112 may additionally have threads to allow a fastener having complementary threads to extend through the opening 112. Further, one peripheral wall $102B_1$ of the plurality of peripheral walls 102B incudes a cut-out 114 extending between an exterior of the peripheral wall $102B_1$ to the hollow space 108 of the enclosure 102. The cut-out 114 may have a design feature, which is complementary to that of the connector of the electronic plug 106. For example, the cut-out 114 has a rectangular shaped design, in the example of FIG. 1B.

In some examples, the electronic port 104 may a universal serial bus (USB) port 104A and the electronic plug may be a USB plug 106A. In such examples, the USB port 104A may have a standard cable connection interface for i) the networking devices (not shown), such as switches, routers, or hubs, and ii) the USB plug 106A. The USB port 104A may have an industry standard receptacle/socket for a short-distance digital data communications and transmissions. In some examples, the USB port 104A may allow the USB plug 106A to be connected to it, in order to receive, transmit, and process the digital data. In some examples, the USB port 104A may also be configured to supply electric power to one or more devices (not shown) via the USB plug 106A that is connected to the USB port 104A. In one or more examples, the electronic port 104, for example, the USB port 104A includes a receptacle 116, a bracket 118, a fastener 120, a biasing member 122, and a circuit board 124.

Figure 2:
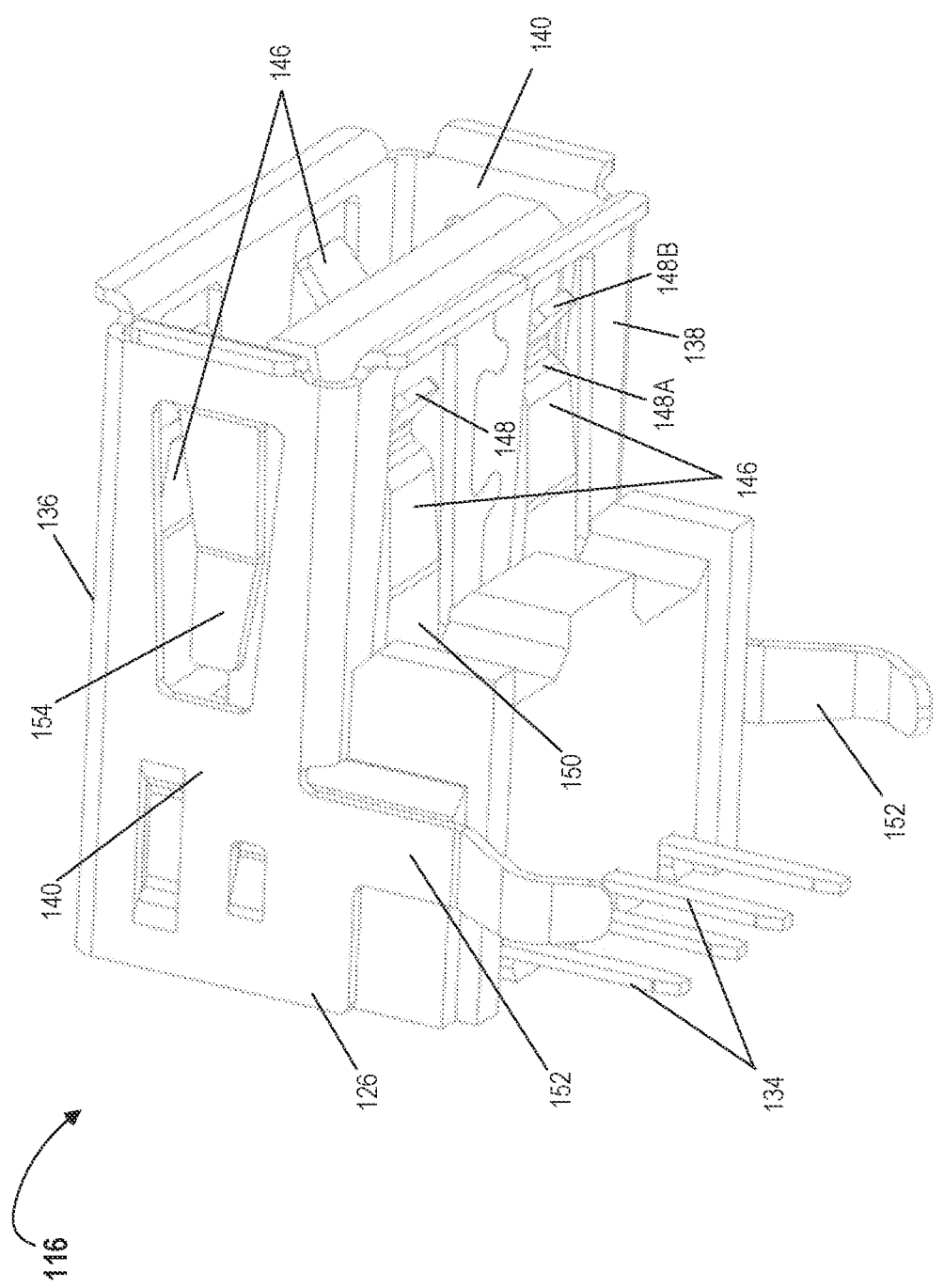
FIG. 2 illustrates an isometric view of a receptacle of the electronic port of FIGS. 1A and 1B according to an example implementation of the present disclosure.
Figure 3:
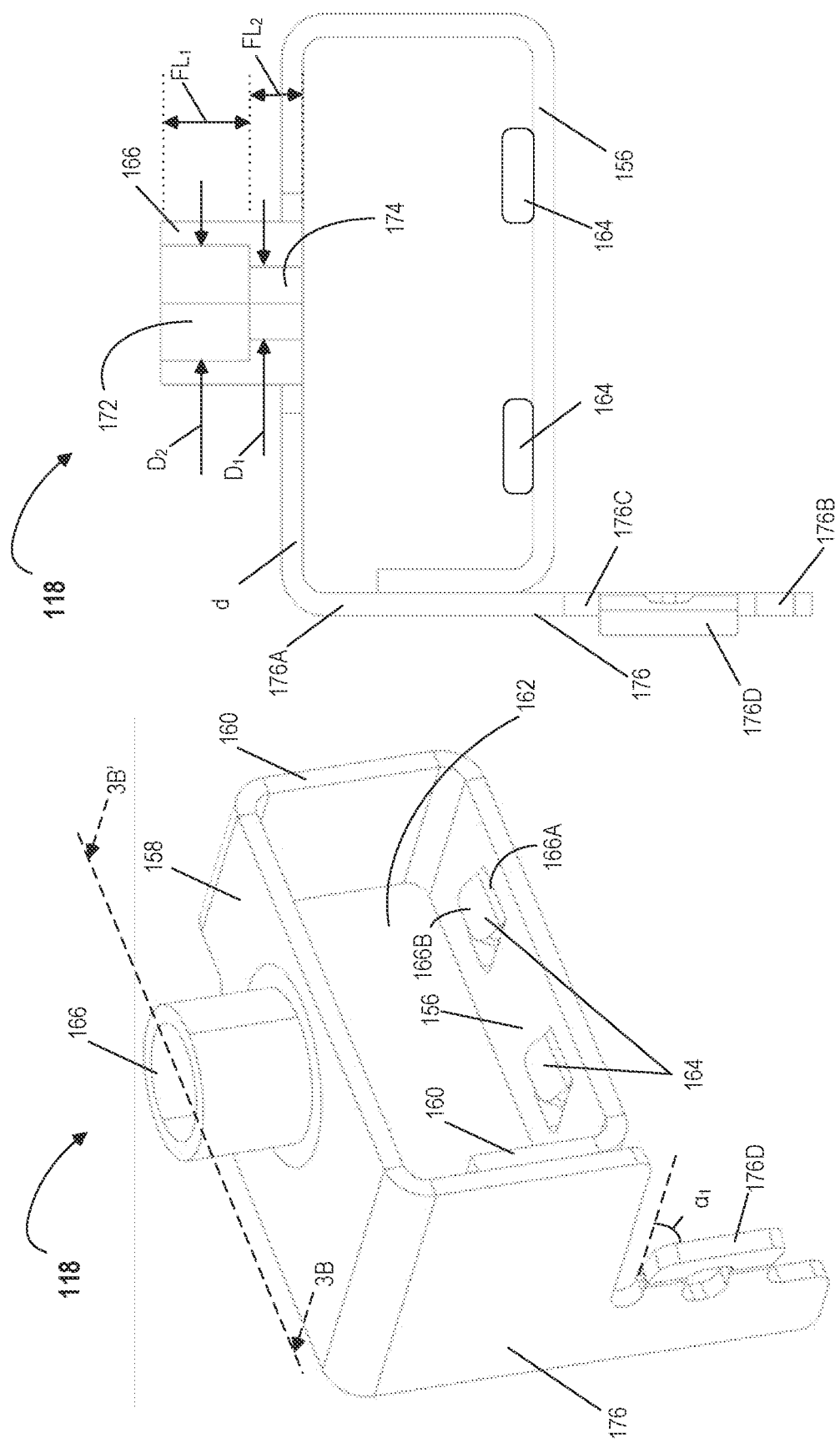
FIG. 3A illustrates an isometric view of a bracket of the electronic port of FIGS. 1A and 1B according to an example implementation of the present disclosure.
FIG. 3B illustrates a cross-sectional view of a bracket of FIG. 3A taken along line 3B-3B' on the bracket of FIG. 3A according to an example implementation of the present disclosure.

In one or more examples, an isometric view of the receptacle 116 shown in FIGS. 1A and 1B, is depicted in FIG. 2. In one or more examples, the receptacle 116 may be a standardized component of the USB port 104A. The receptacle 116 has a shell 126 and a plurality of conductors 134 configured to interface/connect with a connector 128 of the USB plug 106A and the circuit board 124. In some examples, the shell 126 includes a cover 136, a base 138, and a pair of peripheral walls 140, which are coupled to one another to define a hollow space there between for receiving the connector 128 of the USB plug 106A. In one or more examples, each of the cover 136 and the base 138 of the shell 126 may have a plurality of retainers 146. In some examples, each retainer of the plurality of retainers 146 may be a spring finger or a detent. In the example of FIG. 2, each of the cover 136 and the base 138 may have two retainers 146, which are disposed adjacent to one another. Each retainer of the plurality of retainers 146 may be formed around a recess (not labeled) on the cover 136 and the base 138, such that they have cantilevered structure including a freely suspended portion 148 and a fixed portion 150. The freely suspended portion 148 may have a concave portion 148A and a prong portion 148B. In one or more examples, the prong portion 148B is protruded downwards from the concave portion 148A, relative to the base 138. The fixed portion 150 is bent inwards relative to the shell 126 in a normal or a relaxed position. The receptacle 116 may further include a pair of support elements 152 and a peripheral support mechanism 154 in order to provide support to the receptacle 116 within the enclosure 102.

In one or more examples, an isometric view of the bracket 118 shown in FIGS. 1A and 1B, is depicted in FIG. 3A, and a cross-sectional view of the bracket 118 of FIG. 3A taken along line 3B-3B' on the bracket 118 is depicted in FIG. 3B. Referring to FIGS. 3A and 3B, the bracket 118 is one of the component of the locking assembly of the USB port 104A. The bracket 118 is a rigid element made of a bottom portion 156, a top portion 158, and a pair of side walls 160. In such examples, the pair of side walls 160 may be attached to the bottom portion 156 and one of the top portion 158 to define a bore 162 there between. In some examples, the bracket 118 may be made of metal. The bracket 118 may further include a plurality of locking elements 164 and a pillar 166. In some examples, each of the plurality of locking elements 164 may be formed around a recess (not labeled) on the bottom portion 156 of the bracket 118, and disposed adjacent to one another. In one or more examples, each of the plurality of locking elements 164 is a prong having a fixed portion 168A and a protruded portion 168B. In some examples, the protruded portion 168B may have a complementary profile to that of the prong portion 148B of each retainer 146. For example, the protruded portion 168B is protruded upwards from an inner surface of the bottom portion 156 i.e., towards the top portion 158 of the bracket 118, and the fixed portion 168A is attached to the bottom portion 158. The pillar 166 is protruded upwards from the top portion 158 of the bracket 118. In some examples, the pillar 166 has a cylindrical structure having a bore 172 extending downwards to a predefined first length "$FL_1$" from a top surface of the pillar 166, and a counter bore 174 extending upwards to a predefined second length "$FL_2$" from a bottom surface of the pillar 166. In some examples, the predefined first and second lengths "$FL_1$", "$FL_2$" are defined based on a distance that the bracket 118 may have to move vertically upwards for engaging the plurality of locking elements 164 with the plurality of retainers 146. The bore 172 has a second diameter "$D_2$" and the counter bore 174 has the first diameter "$D_1$". In some examples, the counter bore 174 may have threads to allow the fastener 120 having the complementary threads to extend through the counter bore 174. The bracket 118 further includes a support post 176 protruded from the top portion 158. For example, the support post 176 extends adjacent to one of the pair of the side walls 160. The support post 176 includes a top section 176A, a bottom section 176B and a body section 176C connecting the top and bottom sections 176A, 176B. The top section 176A is attached to one of the side wall 160 and the top portion 158 of the bracket 118. The body section 176C and the bottom section 176B are disposed downwards relatively to a horizontal plane of the bottom portion 158 of the bracket 118. In such examples, the body section 176C includes a spring finger 176D, which is bent outwards at a first angle "$\alpha_1$" relative to a vertical plane of the body section 176C, in a normal or a relaxed position. In one or more examples, the support post 176C may be movably coupled to the circuit board 124 of the USB port 104A so as to allow a vertical movement of the bracket 118.

Figure 4:
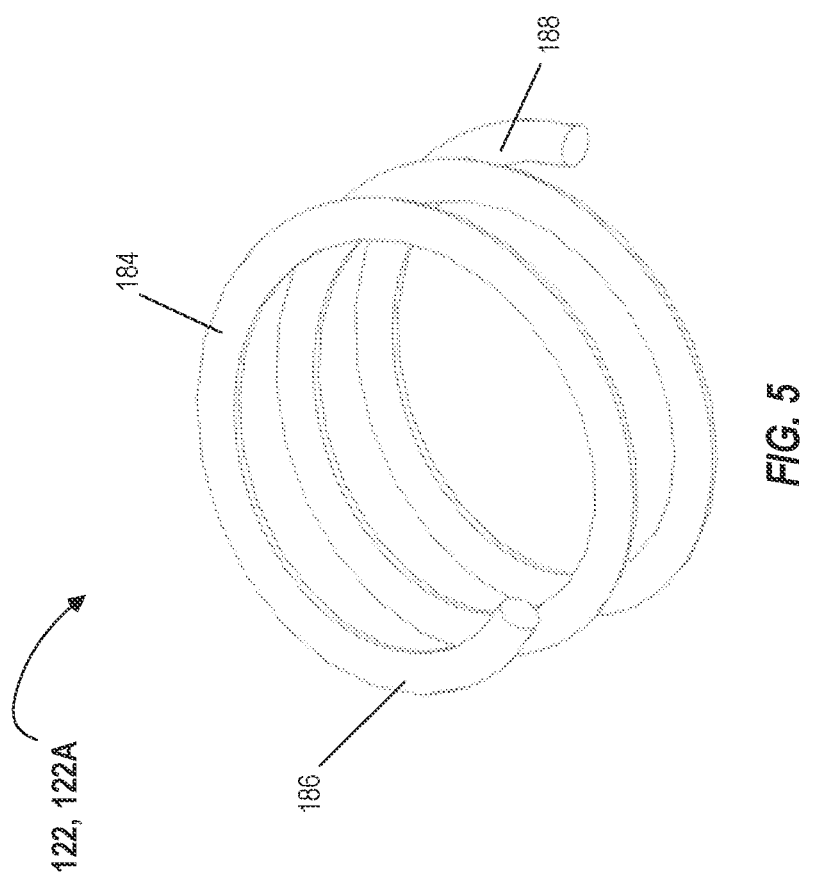
FIG. 4 illustrates an isometric view of a fastener of the electronic port of FIGS. 1A and 1B according to an example implementation of the present disclosure.

In one or more examples, an isometric view of the fastener 120 of FIGS. 1A and 1B, is depicted in FIG. 4. Referring to FIG. 4, the fastener 120 is another component of the locking assembly of the USB port 104A. In some examples, the fastener 120 is a captive screw. It may be noted herein that the captive screw is a special type of screw that may remain freely inside an opening of an object without getting lost from the object, and at the same time may be selectively fastened or unfastened to lock or unlock to/from another object or another portion of the same object. In some examples, the fastener 120 includes a head portion 178, an end portion 180, and a body portion 182 connecting the head and end portions 178, 180. The head portion 178 may have a groove 1788A, for example, a star shaped groove to allow a unique driver (not shown) to fit into it for driving the fastener 120 to fasten and unfasten to/from the object, for example, the counter bore 174 of the pillar 166. The end portion 180 has the first diameter "$D_1$", the body portion 182 has the third diameter "$D_3$", and the head portion 178 has a fourth diameter "$D_4$". In some examples, the third diameter "$D_3$" is smaller than the second diameter "$D_2$", and the fourth diameter "Da" is substantially greater than the first, second, and third diameters "$D_1$", "$D_2$", "$D_3$" respectively. The end portion 180 may have complementary threads, which may first extend through the threads formed in the opening 112, and later extend through the threads formed in the counter bore 174 of the pillar 166.

Figure 5:
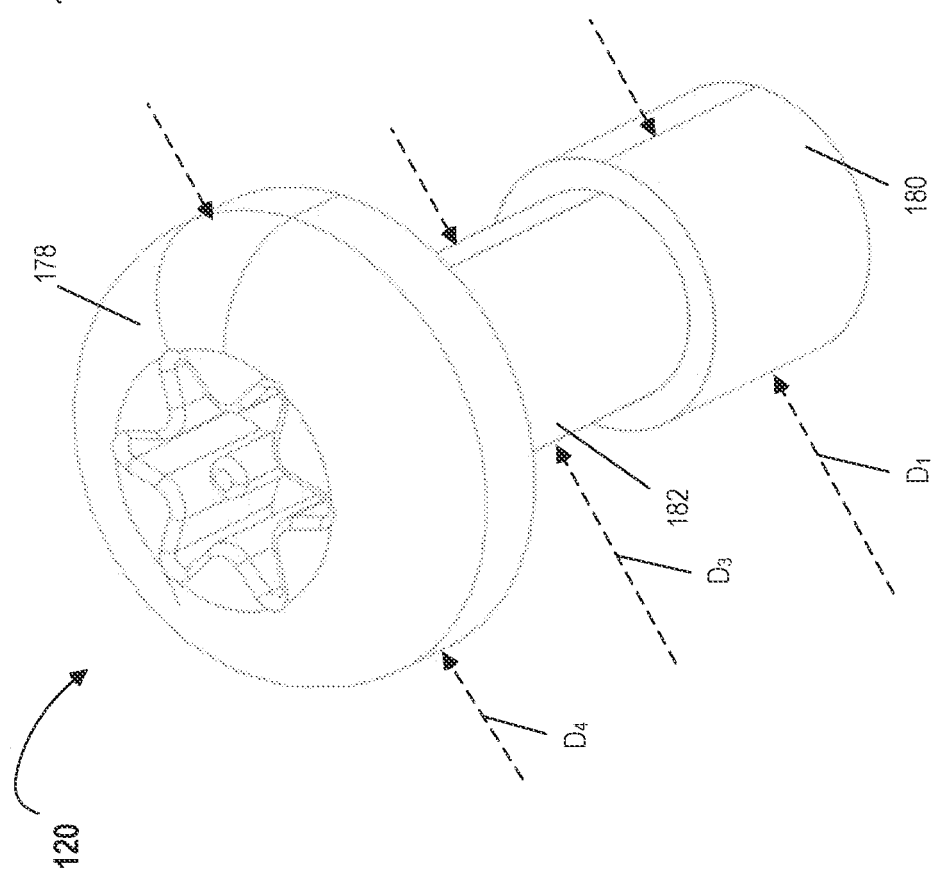
FIG. 5 illustrates an isometric view of a biasing member of the electronic port of FIGS. 1A and 1B according to an example implementation of the present disclosure.

In one or more examples, an isometric view of the biasing member 122 shown in FIGS. 1A and 1B, is depicted in FIG. 5. Referring to FIG. 5, the biasing member 122 is yet another component of the locking assembly of the USB port 104A. In the example of FIG. 5, the biasing member 122 is a spring 122A, for example, a compression spring. In some other examples, the biasing member 122 may be a bellow or the like, without deviating from the scope of the present disclosure. The spring 122A may have a wire 184, which is wrapped in a coil shape that resembles a screw thread. The spring 122A may have ends portions, for example, a first end 186 and a second end 188 disposed in a mutually opposite direction. The spring 122A may be designed to carry, pull, or push loads.

Figure 6:
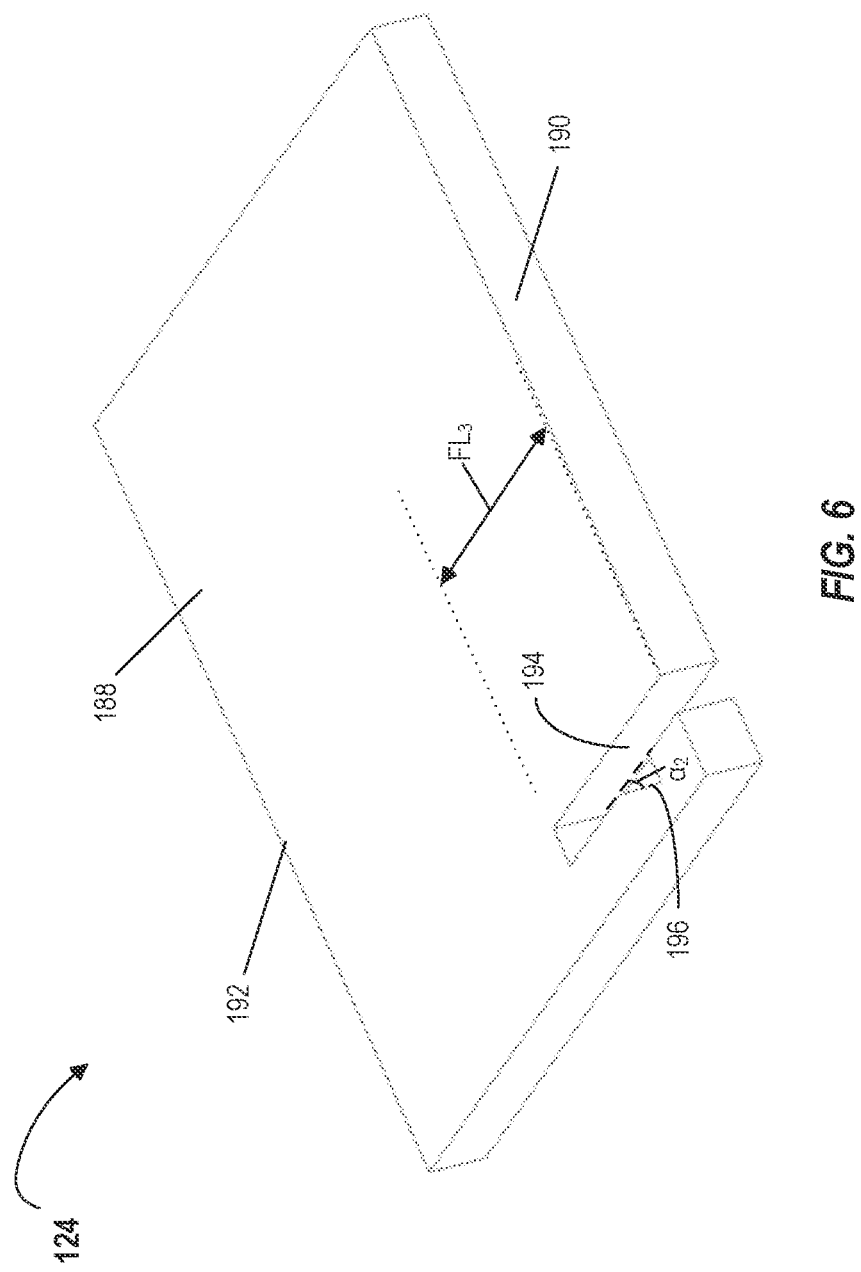
FIG. 6 illustrates an isometric view of a circuit board of the electronic port of FIGS. 1A and 1B according to an example implementation of the present disclosure.

In one or more examples, an isometric view of the circuit board 124 shown in FIGS. 1A and 1B, is depicted in FIG. 6. Referring to FIG. 6, the circuit board 124 may have a substrate 188, for example, an organic substrate or a glass substrate, one or more processing resources (not shown) coupled to the substrate 188, and traces (not shown) formed in the substrate 188 such that it is connected to pads/leads (not shown) of the one or more processing resources, and the plurality of conductors 134 of the receptacle 116 (as shown in FIG. 2). In the example of FIG. 6, the circuit board 124 is a rectangular shaped component having a first and second peripheral sides 190, 192 respectively. In such examples, the circuit board 124 may further include an elongated through-hole 194 extending from the first peripheral side 190 to a predefined third length "$FL_3$" towards the second peripheral side 192. The circuit board 124 may further include a notch or a wedge 196 extending from the elongated through-hole 194. In some examples, the notch or the wedge 196 is inclined at a second angle "$\alpha_2$" relative to a vertical plane of the elongated through-hole 194. The second angle "$\alpha 2$" is substantially same or smaller than the first angle "$\alpha 1$".

Figure 7:
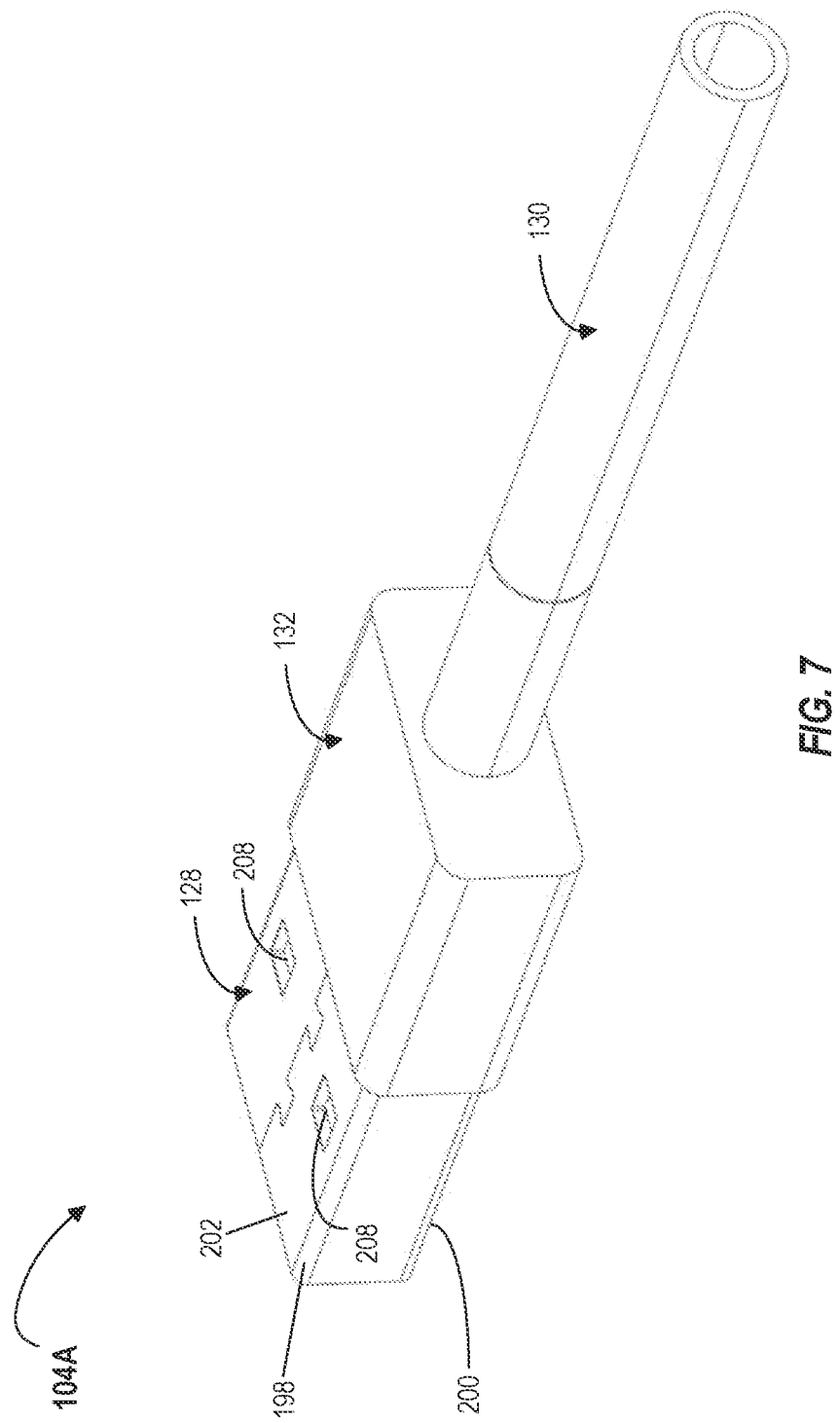
FIG. 7 illustrates an isometric view of the electronic plug of FIGS. 1A and 1B according to an example implementation of the present disclosure.

FIG. 7 depicts an isometric view of the USB plug 106A shown in FIGS. 1A and 1B. In one or more examples, the connector 128 may be a standardized component of the USB plug 106A. The USB plug 106A may include a connector 128 and a USB cable 130, which may be held together by a mold portion 132. The connector 128 has a shell 198 and a plurality of conductors (not shown) disposed within the shell 198. The plurality of conductors may be configured to interface/connect with the plurality of conductors 134 disposed in the receptacle 116 and the USB cable 130. In one or more examples, the shell 198 of the connector 128 is inserted into the hollow space of the receptacle 116, when the USB plug 106A is plugged into the USB port 104A. In some examples, the shell 198 may include a plurality of recesses 208 formed on one of a cover 200 or a base 202 of the connector 128 and disposed adjacent to one another.

Figure 8:
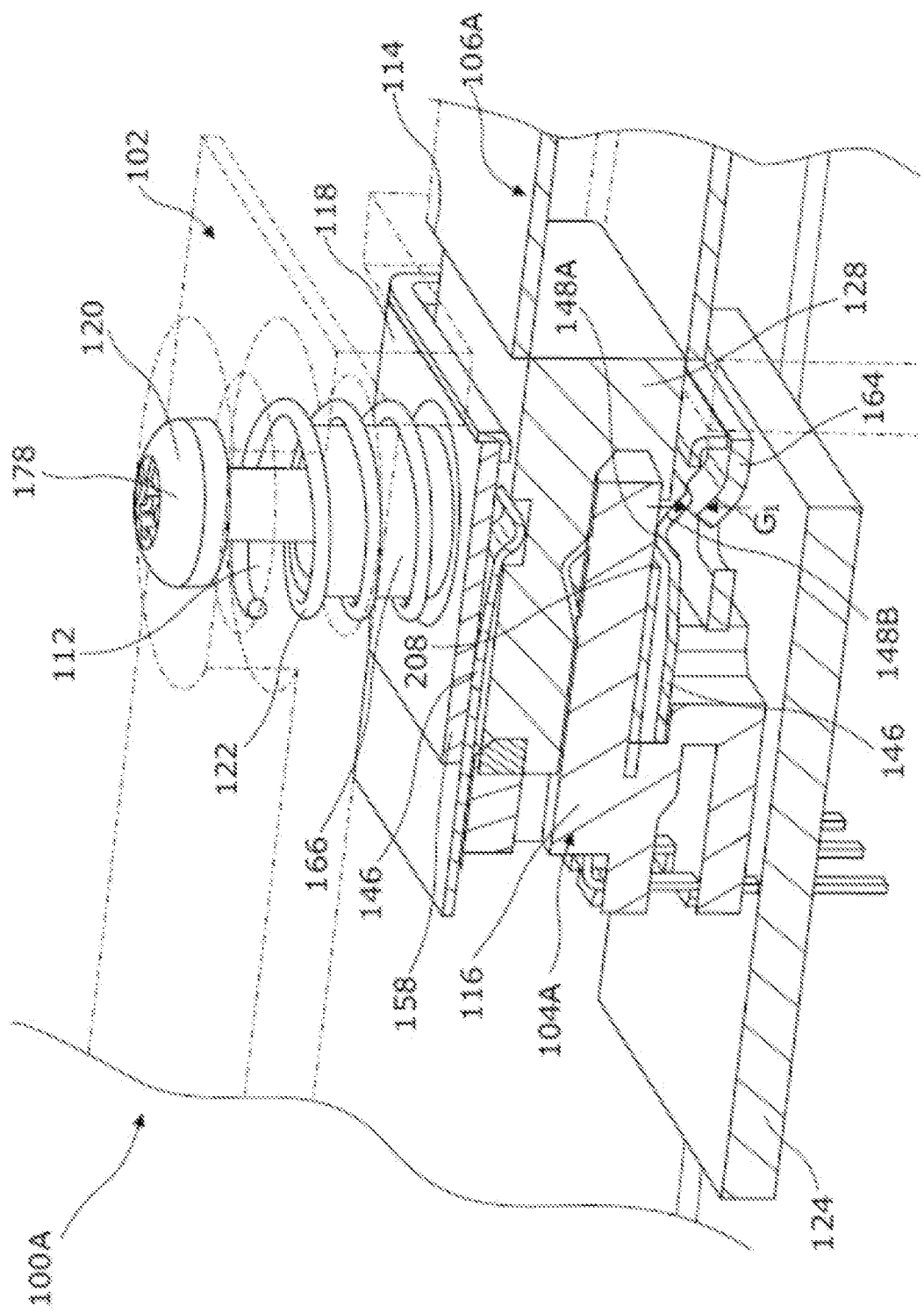
FIG. 8 illustrates a cross-sectional view of a portion of the computing system of FIGS. 1A and 1B having the electronic plug connected to the electronic port and retained in an unlock stage within the electronic port according to an example implementation of the present disclosure.

FIG. 8 depicts a cross-sectional view of a portion of the access point 100A of FIGS. 1A and 1B having the USB plug 106A connected to the USB port 104A and retained in an unlock stage within the USB port 104A. It may be noted herein that the enclosure 102 is shown as a transparent structure in the example of FIG. 8 so as to depict assembled components of the USB port 104A, and the USB plug 106A detachably coupled to the USB port 104A, and such an illustration should not be construed as a limitation of the present disclosure.

Referring to FIGS. 1-8, the receptacle 116 is first coupled to the circuit board 124. For example, the pair of support elements 152 of the receptacle 116 may extend through the holes (not shown) in the circuit board 124 in order to locate and ground the shell 126 of the receptacle 116 with the circuit board 124. Later, the bracket 118 may be disposed around the receptacle 116 by slidably inserting the bracket 118 through the bore 162 of the bracket 118, such that the top portion 158 of the bracket 118 is seated on the receptacle 116 and the plurality of locking elements 164 is vertically aligned with the plurality of retainers 146. In some examples, the spring finger 176D formed in the support post 176D of the bracket 116 is bent inwards so as to align with the plane of the support post 176. In that aligned position, the support post 176 is slidably inserted into the circuit board 124 along a horizontal direction 10, via the elongated through-hole 194 of the circuit board 124. Once, the support post 176 reaches an end of the elongated through-hole 194 (i.e., the end of the third pre-defined length "$FL_3$"), the force applied on the spring finger 176D to bent inwards is released so as to allow the spring finger 176D to restore to its original position, which is the normal position or the relaxed position. In such examples, the spring finger 176D gets engaged with the notch or the wedge 196 formed in the circuit board 124, thereby restricting the horizontal movement 10 of the bracket 116. However, the spring finger 176D may allow a vertical movement 20 of the bracket 116, since the wedge 196 does not restrict the movement of the support post 176 along the vertical direction 20. Further, the biasing member 122 may be disposed around the pillar 166. Subsequently, the assembled components, for example, the receptacle 116, the bracket 118, the circuit board 124, and the biasing member 122 may be disposed within the enclosure 112, where the circuit board 124 may be held within the enclosure 102 by a support structure (not shown) disposed within the enclosure 102. In such examples, end portions 186, 188 of the biasing member 122 may contact the top portion 158 of the bracket 116 and the enclosure 102 in a normal position or a relaxed position of the biasing member 122.

The fastener 120 is projected into the pillar 166 through an opening 112 in the enclosure 102 such that head portion 178 of the fastener 120 remains outside of the enclosure 102, and the end portion 180 of the fastener 120 is disposed within the pillar 166 (not visible in FIG. 8). In some examples, the end portion 180 of the fastener 120 is protected into the pillar 166 by engaging the complementary threads and the threads formed on the end portion 180 of the fastener 180 and the opening 112 of the enclosure 102 respectively. Once, the end portion 180 pass through the opening 112 in the enclosure 102, the body portion 178 of the fastener 120 may freely hang within the enclosure 102 and the end portion 180 may freely hang within the pillar 166. Since, the end portion 180 of the fastener 120 and the opening 112 of the enclosure 102 has the first diameter "$D_1$" and the body portion 178 of the fastener 120 has the second diameter "$D_2$" different from the first diameter "$D_1$" (i.e., second diameter "$D_2$" smaller than the first diameter "$D_1$"), the fastener 120 may be retained within the enclosure 102.

The USB plug 106A may be detachably coupled to the access point 100A by way of plugging the connector 128 of the USB plug 106A into the receptacle 116 of the USB port 104A via the cut-out 114 in the enclosure 102. In such examples, the plurality of retainers 146 may releasably hold the connector 128 within the USB port 104A. For example, the plurality of retainers 146 (e.g., spring finger) may get engaged with the plurality of recesses 208 of the connector 128 in order to releasably hold the USB plug 106A within the USB port 104A. In particular, the concave portion 148A of each retainer 146 may get engaged with a corresponding recess 208 of the connector 128 for releasably holding the USB plug 106A within the USB port 104A.

Since, the top portion 158 of the bracket 118 is disposed directly on the receptacle 116, the plurality of locking elements 164 of the bracket 118 is positioned vertically below the plurality of retainers 146 at a gap "G1". In other words, the plurality of locking elements 164 is not engaged with the plurality of retainers 146. Thus, the engagement of the concave portion 148A of each retainer 146 (spring finger) with the corresponding recess 208 may releasably hold the USB plug 106A within the USB port 104A in an unlocked stage of the access point 100A. Accordingly, the concave portion 148A of each retainer 146 may not restrict (or allow) plugging out of the USB plug 106A from the USB port 104A.

FIG. 9 depicts a cross-sectional view of a portion of the access point 100A of FIGS. 1A and 1B having the USB plug 106A connected to the USB port 104A and retained in a lock stage within the USB port 104A. It may be noted herein that the enclosure 102 is shown as a transparent structure in the example of FIG. 9 so as to depict assembled components of the USB port 104A, and the USB plug 106A detachably coupled to the USB port 104A, and such an illustration should not be construed as a limitation of the present disclosure. FIG. 9 represents the locked stage of the USB plug 106A within the USB port 104A from the unlocked stage of the USB plug 106A as depicted in FIG. 8. Accordingly, when the plurality of retainers 146 of the USB port 104A is engaged with the plurality of recesses 208 of the USB plug 106A, the fastener 120 is fastened into the counter bore 174 (as shown in FIG. 3B) of the pillar 166 so as to allow a vertical movement 20 of the bracket 118 along a first direction 21 in order to engage the plurality of locking elements 164 of the bracket 118 with the plurality of retainers 146 in the receptacle 116. In particular, the protruded portion 168B of each locking element 164 is engaged with the prong portion 148B of corresponding retainer 146 in order to restrict plugging out of the USB plug 106A from the USB port 104A. In such examples, the vertical movement 20 of the bracket 118 causes, the top portion 158 of the bracket 118 to be vertically positioned above the receptacle 116 at a gap "G2".

In some examples, the biasing member 122 is compressed to allow the vertical movement 20 of the bracket 118 in the first direction 21 when the fastener is fastened into the counter bore 174 of the pillar 166 so as to engage the plurality of locking elements 164 with the plurality of retainers 146 for locking the connector 128 of the USB plug 106B with the retainer 116 of the USB port 104A, and retaining the access point 110A in the locked stage, as shown in FIG. 9. In some other examples, the biasing member is released to allow the vertical movement of the bracket in a second direction 23 opposite to the first direction 21, when the fastener is unfastened from the counter bore 174 of the pillar 166 so as to disengage the plurality of locking elements 164 from the plurality of retainers 146 for unlocking the connector 128 of the USB plug 106B from the receptacle 116 of the USB port 104A, and releasing the access point 100A from the locked stage, as shown in FIG. 8.

FIG. 10 is a flow diagram depicting a method 1000 of locking an electronic plug within an electronic port of a computing system. It should be noted herein that the method 1000 is described in conjunction with FIGS. 1-9.

The method 1000 starts at block 1002 and continues to block 1004. At block 1004, the method 1000 includes connecting a connector of the electronic plug to a receptacle of the electronic port, when the electronic plug is detachably coupled to the electronic port. In some examples, the electronic plug is pushed inside a cut-out in an enclosure of the computing system in order to connect/attach the electronic plug to the electronic port. The method 1000 moves to block 1006.

At block 1006, the method 1000 includes aligning a plurality of recesses in a connector of the electronic plug with a plurality of retainers in the receptacle of the electronic port so as to engage each retainer with a corresponding recess for releasably holding the connector to the receptacle. In one or more examples, the electronic plug may be pulled from the opening of the enclosure in the computing system in order to release (disconnect/detach) the connector of the electronic plug from the receptacle of the electronic port. In other words, the plurality of retainers may apply force on the plurality of recesses to retain the connector of the electronic plug within the receptacle of the electronic port. In such examples, when a counter force is applied to detach the electronic plug from the electronic port, the plurality of retainers may bend outwards to disengage from the plurality of recesses, thereby allowing the connector to be released from the receptacle and plugging out of the electronic plug from the electronic port. The method 1000 moves to block 1008.

At block 1008, the method 1000 includes fastening a fastener of the electronic port into a counter bore of a bracket of the electronic port to allow a vertical movement of the bracket along a first direction in order to engage a plurality of locking elements of the bracket with the plurality of retainers for locking the electronic plug within the electronic port. In one or more examples, the plurality of locking elements may move vertical upwards and engage with the plurality of retainers so as to restrict the plurality of retainers to bend outwards for disengaging from the plurality of recesses. Thereby, disallowing plugging out (removing) of the electronic plug from the electronic port.

In some examples, the method 1000 may further includes the step of unfastening the fastener from the counter bore of the pillar to allow the vertical movement of the bracket along a second direction opposite to the first direction in order to disengage the plurality of locking elements from the plurality of retainers for unlocking the electronic plug from the electronic port. In one or more examples, the plurality of locking elements may move vertically downwards from the plurality of retainers so as to allow the plurality of retainers to bend outwards for disengaging from the plurality of recesses. Thereby, allowing plugged out (removing) of the electronic plug from the electronic port.

In some examples, the electronic port may include a biasing member disposed around the pillar such that end portions of the biasing member contacts the bracket and the enclosure. In such examples, the biasing member is compressed to allow the vertical movement of the bracket in the first direction (upwards) when the fastener is fastened into the counter bore of the pillar, and released to allow the vertical movement of the bracket in the second direction (downwards) when the fastener is unfastened from the counter bore of the pillar. Thus, the biasing member may aid in maintain the access point in a locked or unlocked stage. The method 1000 ends at block 1010.

Various features as illustrated in the examples described herein may be implemented in a system, such as a computing system having an electronic port. In particular, the electronic port may have a locking assembly (or a security assembly) to prevent unauthorized removal of the electronic plug when plugged into the computing system. The locking assembly may include components, which are internal to the electronic port, which occupies a substantially little space due to its integration with one or more standardized components of the electronic ports, and which may have a complementary design to that of standardized components of the electronic port, and which are of a miniaturized nature in design. The locking assembly of the present disclosure has a simple design, which may allow the cost to be substantially low. Further, the locking assembly disclosed herein is self-contained and does not use additional components external to the electronic plug for locking or unlocking purpose of the electronic plug. Further, since the bracket and the plurality of locking elements of the bracket are rigid components (i.e., does not include flexible portion) for engaging with the retainers for locking and/or unlocking the electronic plug with/from the electronic port, the self-life of the bracket may be substantially high.

In the foregoing description, numerous details are set forth to provide an understanding of the subject matter disclosed herein. However, implementation may be practiced without some or all of these details. Other implementations may include modifications, combinations, and variations from the details discussed above. It is intended that the following claims cover such modifications and variations.

What is claimed is:

1. An electronic port comprising:
a receptacle comprising a plurality of retainers to releasably hold a connector of an electronic plug, when the electronic plug is detachably coupled to the electronic port;
a bracket disposed around the receptacle, wherein the bracket comprises a plurality of locking elements and a pillar having a counter bore, and wherein the plurality of locking elements is aligned with the plurality of retainers; and
a fastener projected into the pillar through an enclosure, wherein the fastener is fastened into the counter bore of the pillar to allow a vertical movement of the bracket along a first direction so as to engage the plurality of locking elements with the plurality of retainers.

2. The electronic port of claim 1, wherein the bracket is a rigid element having a bottom portion, a top portion, and a pair of side walls attached to the bottom portion and one of the top portion to define a bore there between, and wherein the bracket is disposed around the receptacle through the bore, such that the top portion of the bracket is seated on the receptacle.

3. The electronic port of claim 2, wherein the bracket further comprises a support post protruded from the top portion of the bracket, and wherein the support post extends adjacent to one of the pair of the side walls and movably coupled to a circuit board of the electronic port, to allow the vertical movement of the bracket.

4. The electronic port of claim 2, wherein each of the plurality of locking elements is a prong protruded upwards from the bottom portion of the bracket, and wherein the pillar is protruded upwards from the top portion of the bracket.

5. The electronic port of claim 2, further comprising a biasing member disposed around the pillar such that end portions of the biasing member contacts the top portion of the bracket and the enclosure.

6. The electronic port of claim 5, wherein the biasing member is a helical spring, or a bellow.

7. The electronic port of claim 5, wherein the biasing member is compressed to allow the vertical movement of the bracket in the first direction when the fastener is fastened into the counter bore of the pillar, and wherein the biasing member is released to allow the vertical movement of the bracket in a second direction opposite to the first direction, when the fastener is unfastened from the counter bore of the pillar so as to disengage the plurality of locking elements from the plurality of retainers.

8. The electronic port of claim 1, wherein the electronic port is a universal serial bus (USB) port.

9. The electronic port of claim 1, wherein the fastener is a captive screw, comprising a head portion, an end portion, and a body portion connecting the head and end portions, wherein the fastener is projected into the pillar through an opening in the enclosure such that the head portion of the fastener remains outside of the enclosure and the end portion of the fastener is disposed within the pillar, and wherein each of the end portion of the fastener and the opening of the enclosure has a first diameter and the body portion of the fastener has a second diameter different from the first diameter so as to retain the fastener within the enclosure.

10. A computing system comprising:
an enclosure having a cut-out and an opening;
an electronic port disposed within the enclosure, comprising:
a receptacle comprising a plurality of retainers;
a bracket disposed around the receptacle, wherein the bracket comprises a plurality of locking elements and a pillar having a counter bore, and wherein the plurality of locking elements is aligned with the plurality of retainers; and
a fastener projected into the pillar through the opening in the enclosure; and
an electronic plug having a connector connected to the receptacle, when the electronic plug is coupled to the electronic port through the cut-out in the enclosure, wherein the connector has a plurality of recesses aligned with the plurality of retainers in the receptacle so as to engage each retainer with a corresponding recess for releasably holding the connector to the receptacle, and wherein the fastener is fastened into the counter bore of the pillar to allow a vertical movement of the bracket along a first direction so as to engage the plurality of locking elements with the plurality of retainers for locking the electronic plug within the electronic port.

11. The computing system of claim 10, wherein the electronic port is a universal serial bus (USB) port and the electronic plug is a USB device.

12. The computing system of claim 10, wherein each of the plurality of retainers is a spring finger, and wherein the biasing member is a helical spring or a bellow.

13. The computing system of claim 10, wherein the bracket is a rigid element having a bottom portion, a top portion, and a pair of side walls attached to the bottom portion and one of the top portion to define a bore there between, and wherein the bracket is disposed around the receptacle through the bore, such that the top portion of the bracket is seated on the receptacle.

14. The computing system of claim 13, wherein the bracket further comprises a support post protruded from the top portion of the bracket, and wherein the support post extends adjacent to one of the pair of side walls and movably coupled to a circuit board of the electronic port, to allow the vertical movement of the bracket.

15. The computing system of claim 13, wherein each of the plurality of locking elements is a prong protruded upwards from the bottom portion of the bracket, and wherein the pillar is protruded upwards from the top portion of the bracket.

16. The computing system of claim 13, further comprising a biasing member disposed around the pillar such that end portions of the biasing member contacts the top portion of the bracket and the enclosure.

17. The computing system of claim 13, wherein the biasing member is compressed to allow the vertical movement of the bracket in the first direction when the fastener is fastened into the counter bore of the pillar, and wherein the biasing member is released to allow the vertical movement of the bracket in a second direction opposite to the first direction, when the fastener is unfastened from the counter bore of the pillar so as to disengage the plurality of locking elements from the plurality of retainers for unlocking the electronic plug from the electronic port.

18. The computing system of claim 10, wherein the fastener is a captive screw, comprising a head portion, an end portion, and a body portion connecting the head and end portions, wherein the head portion remains outside of the enclosure and the end portion of the fastener is disposed within the pillar, and wherein each of the end portion of the fastener and the opening of the enclosure has a first diameter and the body portion of the fastener has a second diameter different from the first diameter so as to retain the fastener within the enclosure.

19. A method comprising:
connecting a connector of an electronic plug to a receptacle of an electronic port when the electronic plug is detachably coupled to the electronic port,
wherein the electronic port further comprises a bracket disposed around the receptacle, wherein the bracket comprises a plurality of locking elements and a pillar having a counter bore, wherein the plurality of locking elements is aligned with a plurality of retainers of the receptacle, and a fastener projected into the pillar via an enclosure, and wherein the connector has a plurality of recesses aligned with the plurality of retainers;
aligning the plurality of recesses in the connector with the plurality of retainers in the receptacle so as to engage each retainer with a corresponding recess for releasably holding the connector to the receptacle; and
fastening a fastener into the counter bore of the pillar to allow a vertical movement of the bracket along a first direction so as to engage the plurality of locking elements with the plurality of retainers for locking the electronic plug within the electronic port.

20. The method of claim 19, further comprising unfastening the fastener from the counter bore of the pillar to allow the vertical movement of the bracket along a second direction opposite to the first direction so as to disengage the plurality of locking elements from the plurality of retainers for unlocking the electronic plug within the electronic port,
wherein the electronic port further comprises a biasing member disposed around the pillar such that end portions of the biasing member contacts the bracket and the enclosure, and
wherein the biasing member is compressed to allow the vertical movement of the bracket in the first direction when the fastener is fastened into the counter bore of the pillar, and released to allow the vertical movement of the bracket in the second direction when the fastener is unfastened from the counter bore of the pillar.

* * * * *